(12) United States Patent
Yakushiji et al.

(10) Patent No.: US 11,887,814 B2
(45) Date of Patent: Jan. 30, 2024

(54) PLASMA PROCESSING METHOD

(71) Applicant: Hitachi High-Tech Corporation, Tokyo (JP)

(72) Inventors: Mamoru Yakushiji, Tokyo (JP); Kenichi Kuwahara, Tokyo (JP); Masaaki Taniyama, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/277,812

(22) PCT Filed: Feb. 10, 2020

(86) PCT No.: PCT/JP2020/005075
§ 371 (c)(1),
(2) Date: Mar. 19, 2021

(87) PCT Pub. No.: WO2021/161368
PCT Pub. Date: Aug. 19, 2021

(65) Prior Publication Data
US 2022/0384148 A1    Dec. 1, 2022

(51) Int. Cl.
*H01L 21/311* (2006.01)
*H01J 37/32* (2006.01)
*H01L 21/027* (2006.01)

(52) U.S. Cl.
CPC .... *H01J 37/32146* (2013.01); *H01L 21/0276* (2013.01); *H01L 21/31138* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,969,211 B2 | 3/2015 | Muto et al. | |
| 10,121,640 B2 | 11/2018 | Muto et al. | |
| 2010/0219158 A1 | 9/2010 | Morikawa et al. | |
| 2012/0021605 A1 | 1/2012 | Omura et al. | |
| 2012/0238100 A1 | 9/2012 | Akiba | |
| 2013/0157470 A1 | 6/2013 | Watanabe et al. | |

(Continued)

FOREIGN PATENT DOCUMENTS

| | | |
|---|---|---|
| CN | 103779203 A | 5/2014 |
| CN | 104103486 A | 10/2014 |

(Continued)

OTHER PUBLICATIONS

JP 2017-22136 (translation) (Year: 2017).*

(Continued)

*Primary Examiner* — Roberts P Culbert
(74) *Attorney, Agent, or Firm* — MILES & STOCKBRIDGE, P.C.

(57) ABSTRACT

Provided is a plasma processing method capable of improving an etching selectivity of a material to be etched with respect to a mask material and reducing a roughness of a side wall of a mask pattern. The plasma processing method of selectively depositing a deposition film on the mask material with respect to the material to be etched includes controlling an etching parameter so that an incubation time of the mask material is shorter than an incubation time of the material to be etched.

8 Claims, 13 Drawing Sheets

(56) References Cited

U.S. PATENT DOCUMENTS

| | | |
|---|---|---|
| 2014/0151327 A1 | 6/2014 | Une et al. |
| 2014/0302682 A1 | 10/2014 | Muto et al. |
| 2015/0048049 A1 | 2/2015 | Nishimura et al. |
| 2015/0093903 A1 | 4/2015 | Aoyama |
| 2015/0170880 A1 | 6/2015 | Muto et al. |
| 2017/0140923 A1 | 5/2017 | Watanabe et al. |
| 2018/0286697 A1 | 10/2018 | Posseme et al. |

FOREIGN PATENT DOCUMENTS

| | | | |
|---|---|---|---|
| CN | 106206307 A | * | 12/2016 |
| JP | 2012028431 A | | 2/2012 |
| JP | 2013118359 A | | 6/2013 |
| JP | 2013207089 A | | 10/2013 |
| JP | 2014107520 A | | 6/2014 |
| JP | 2015070232 A | | 4/2015 |
| JP | 2015076490 A | | 4/2015 |
| JP | 2017022136 A | | 1/2017 |
| JP | 2017092376 A | | 5/2017 |
| KR | 10-2012-0104945 A | | 9/2012 |
| KR | 10-2017-0057146 A | | 5/2017 |
| KR | 10-2018-0050743 A | | 5/2018 |
| WO | 2007135906 A1 | | 11/2007 |

OTHER PUBLICATIONS

CN 106206307 A (translation) (Year: 2016).*
Search Report dated Apr. 14, 2020 in corresponding International Application No. PCT/JP2020/005075.
Written Opinion dated Apr. 14, 2020 in corresponding International Application No. PCT/JP2020/005075.
Office Action dated Jan. 13, 2023 in Korean Application No. 10-2021-7001573.
Office Action dated Apr. 28, 2023 in Chinese Application No. 202080004046.4.

* cited by examiner

[FIG. 1]
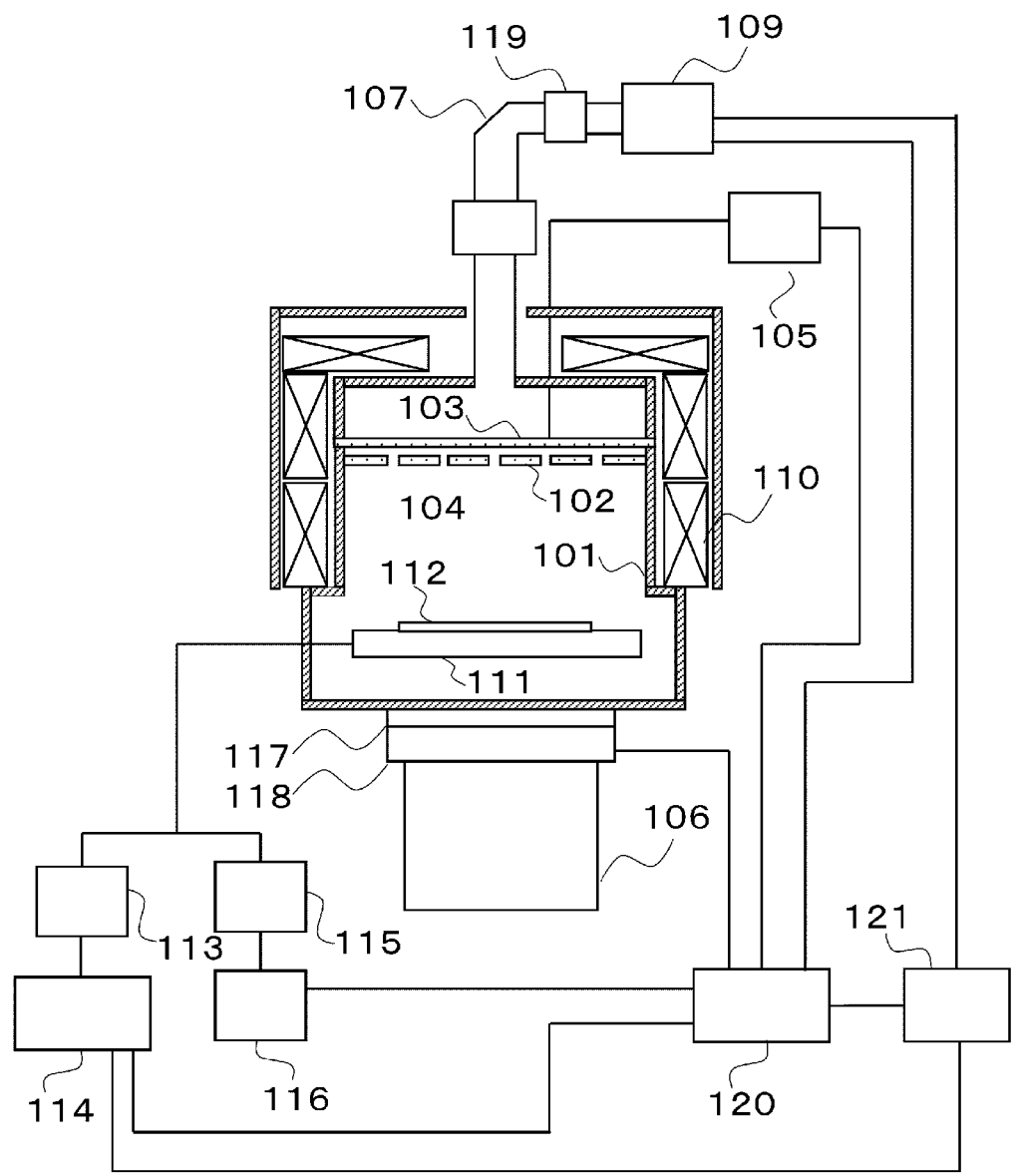

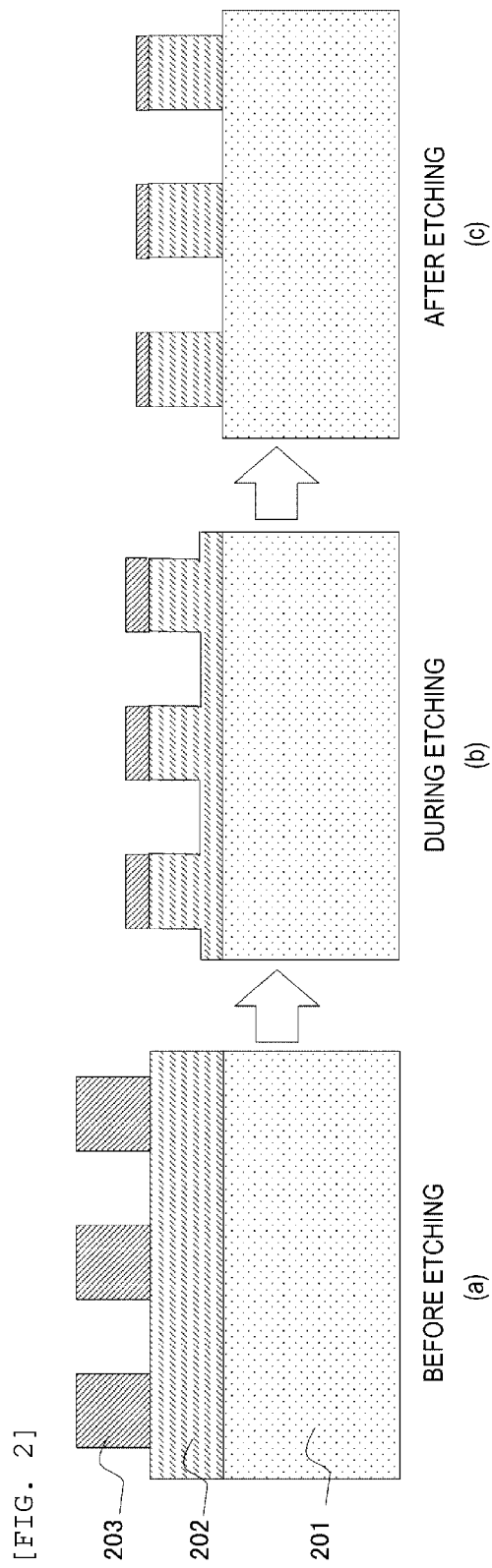

[FIG. 3]
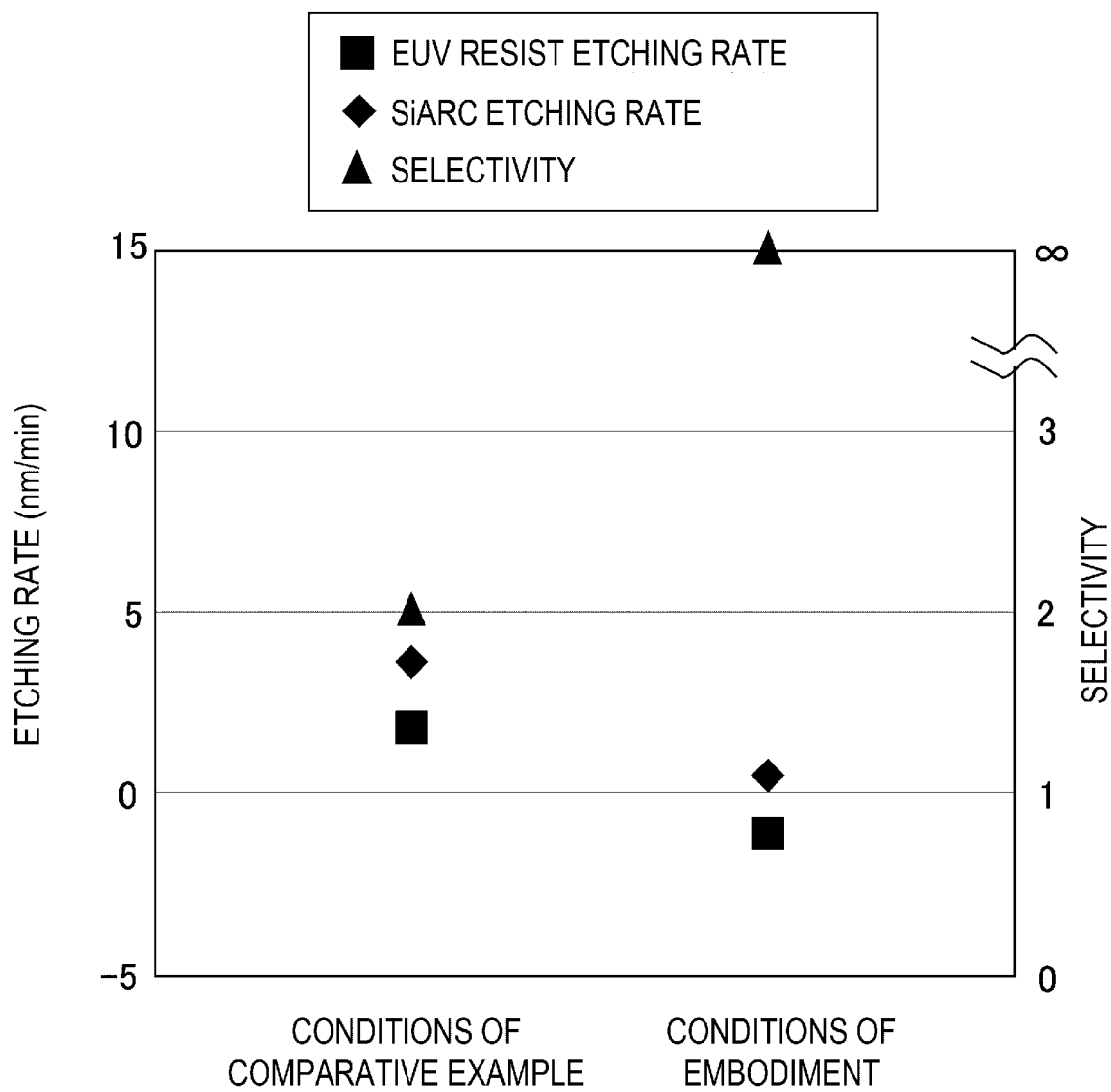

[FIG. 4]
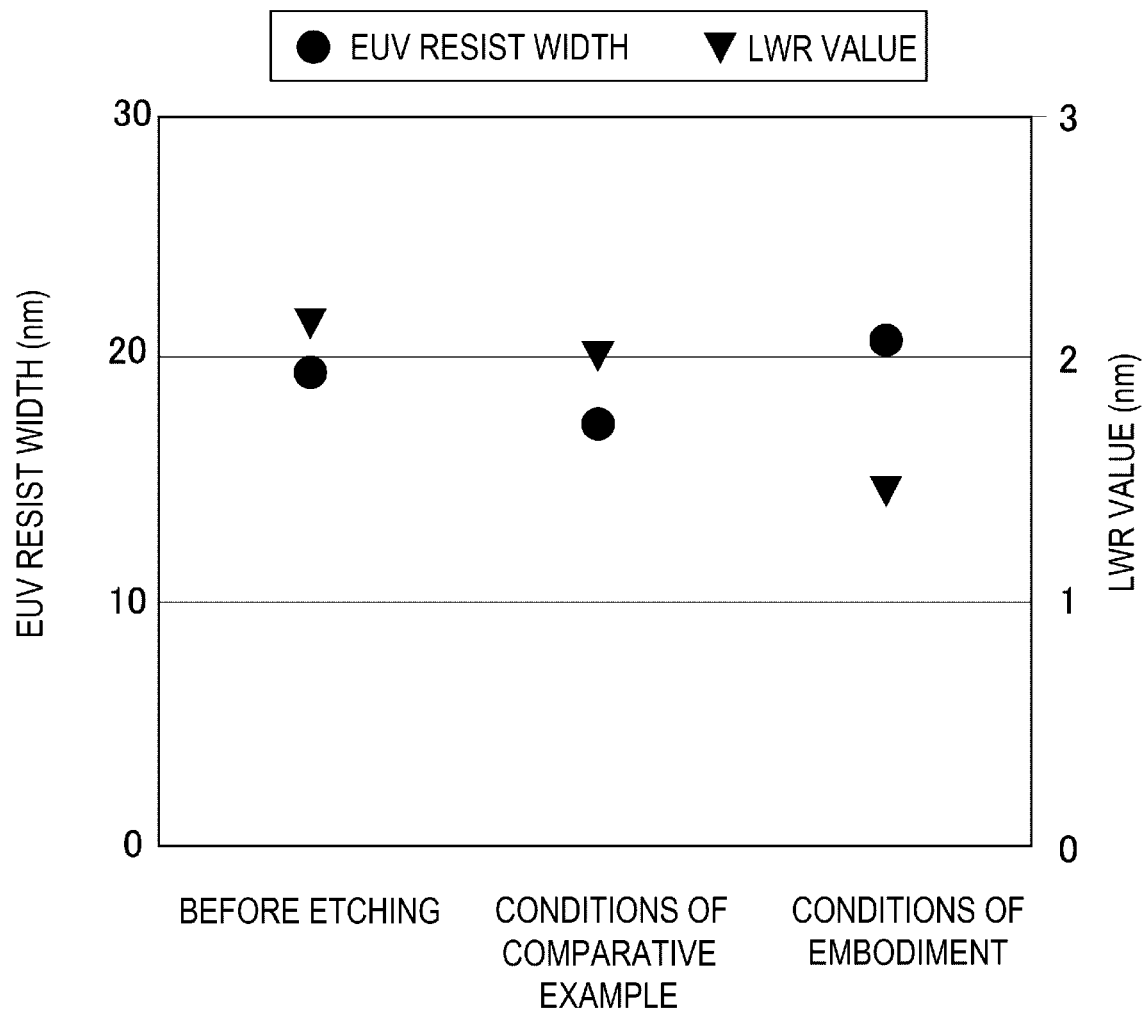

[FIG. 5]

FIRST STAGE

ADJUST MICROWAVE POWER SUPPLY POWER

NOTE) NO MICROWAVE POWER SUPPLY REPETITION
RADIO FREQUENCY POWER SUPPLY POWER: 0 W

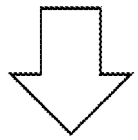

SECOND STAGE

ADJUST RADIO FREQUENCY
BIAS POWER SUPPLY POWER

NOTE) NO RADIO FREQUENCY BIAS
POWER SUPPLY POWER REPETITION
MICROWAVE POWER SUPPLY POWER: 800 W

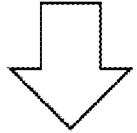

THIRD STAGE

ADJUST REPETITION FREQUENCY AND DUTY RATIO
OF MICROWAVE POWER SUPPLY AND RAIDO
FREQUENCY BIAS POWER SUPPLY

NOTE) MICROWAVE POWER SUPPLY POWER: 800 W
RADIO FREQUENCY POWER SUPPLY POWER: 20 W

[FIG. 6]
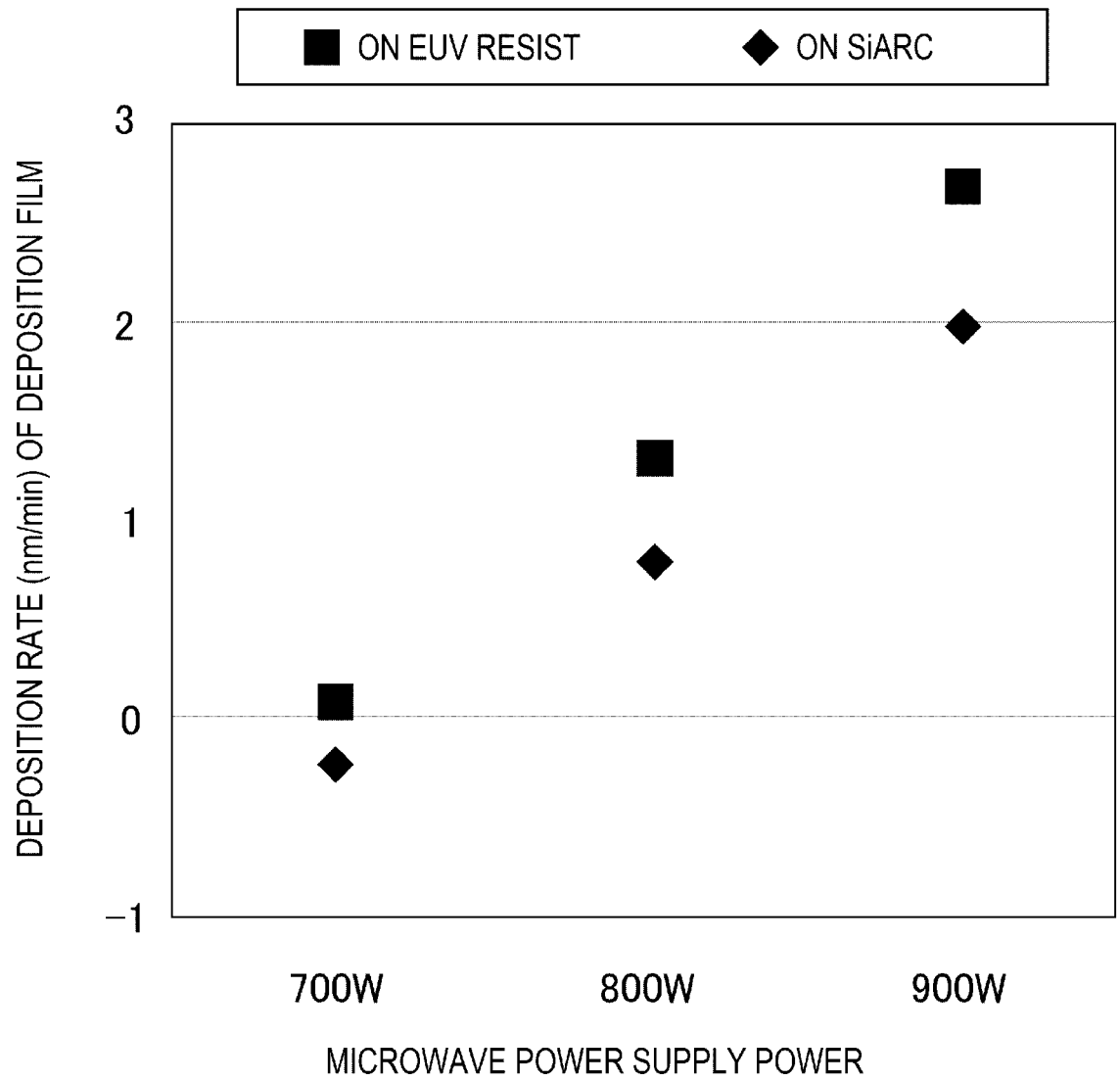

[FIG. 7]
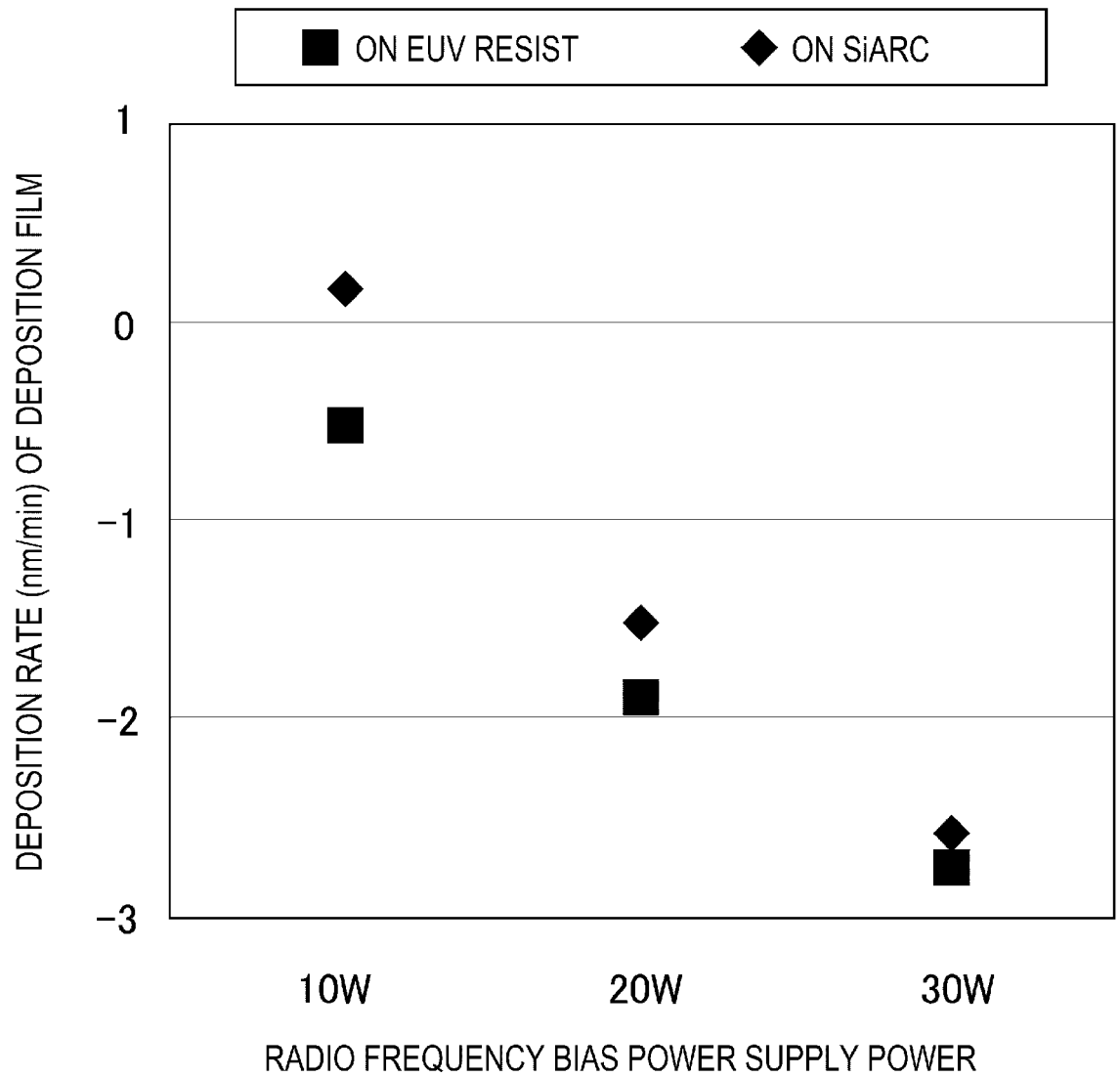

[FIG. 8]
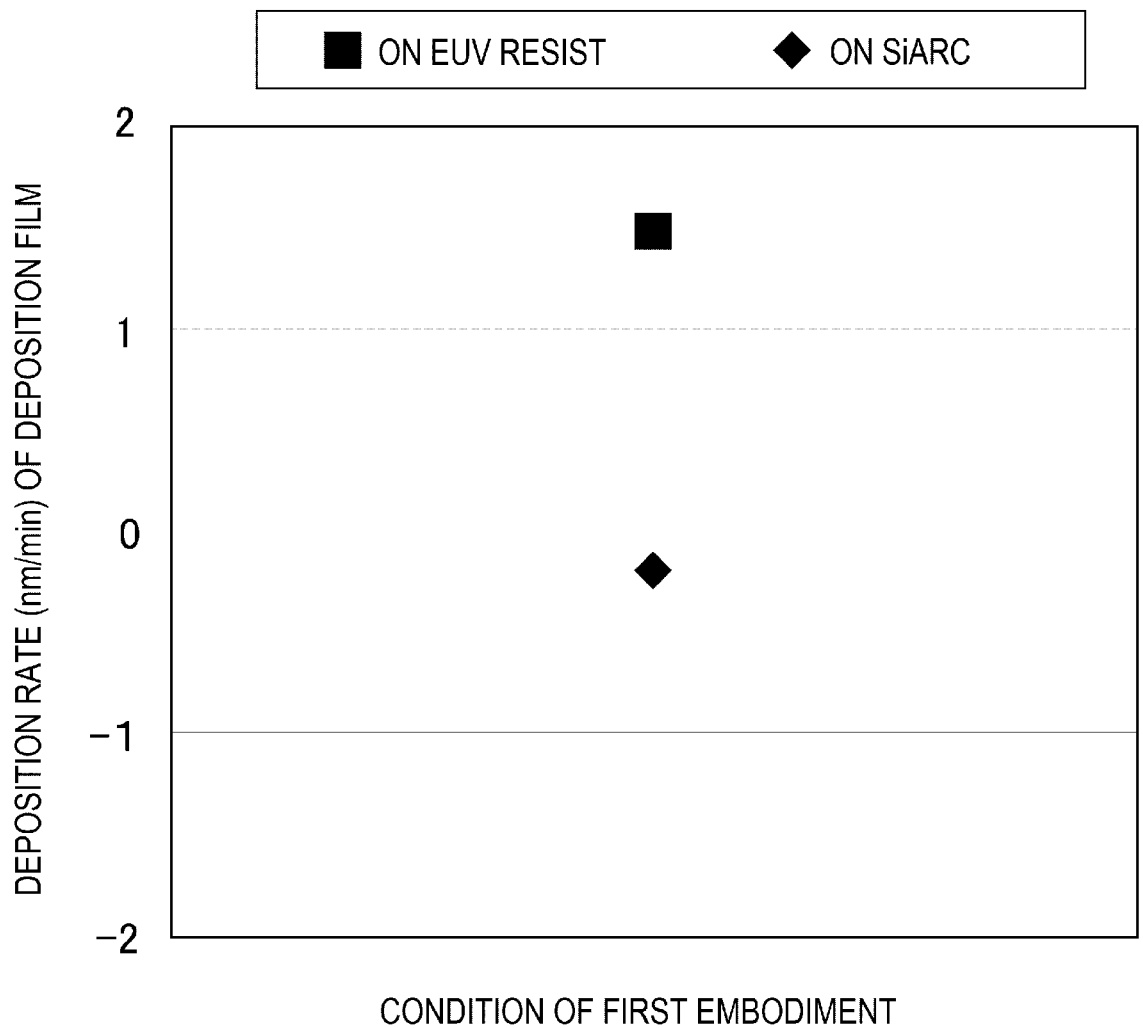

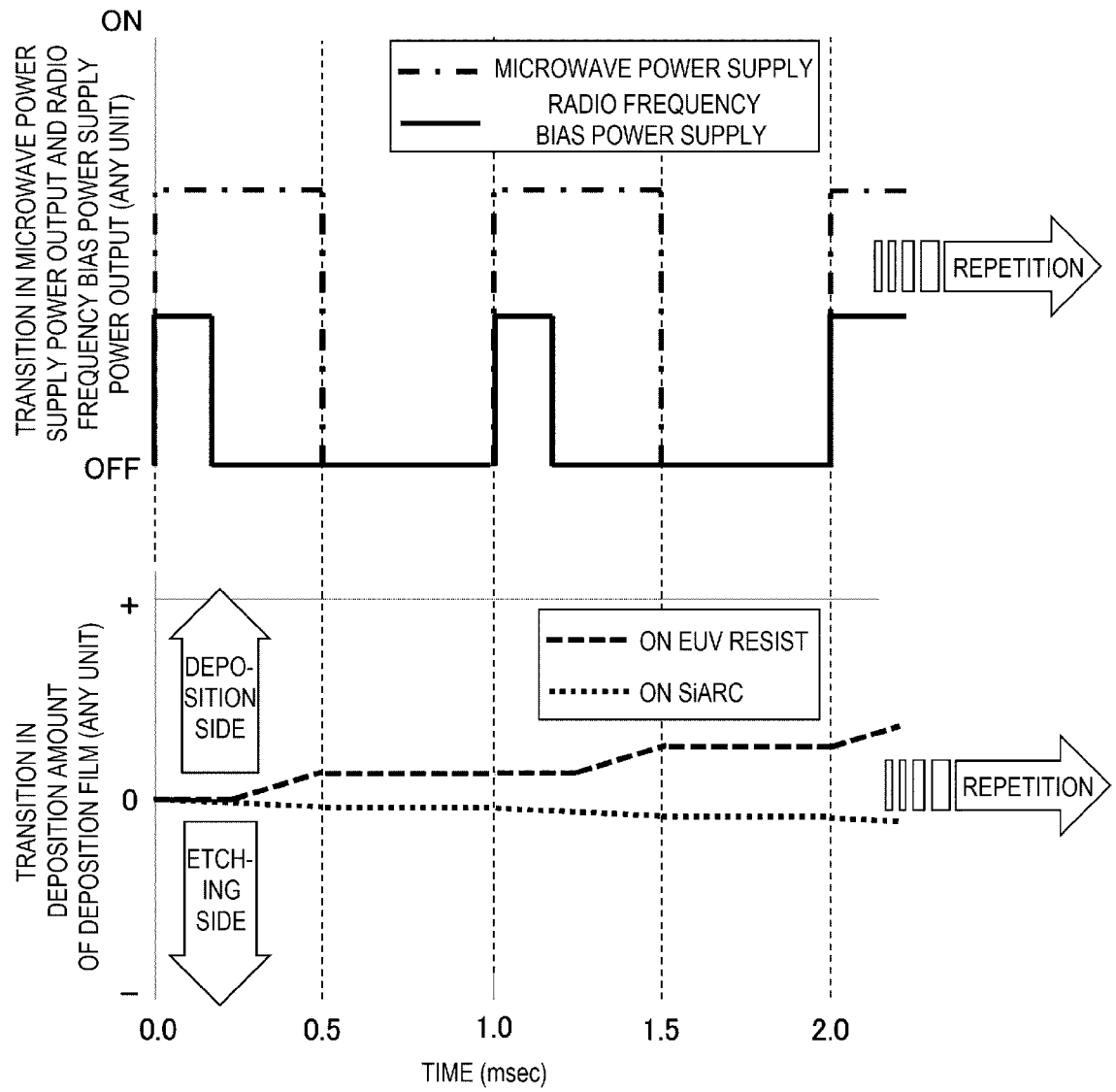
[FIG. 9]

[FIG. 10]
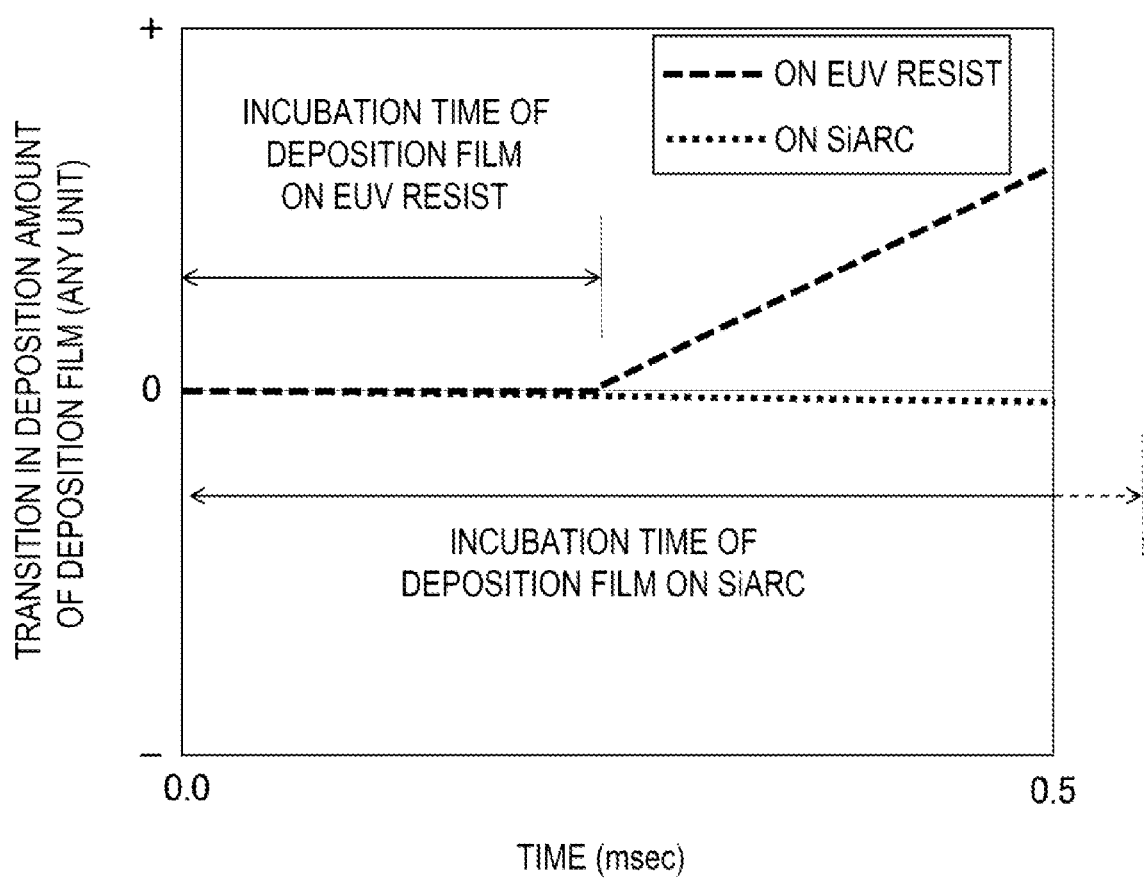

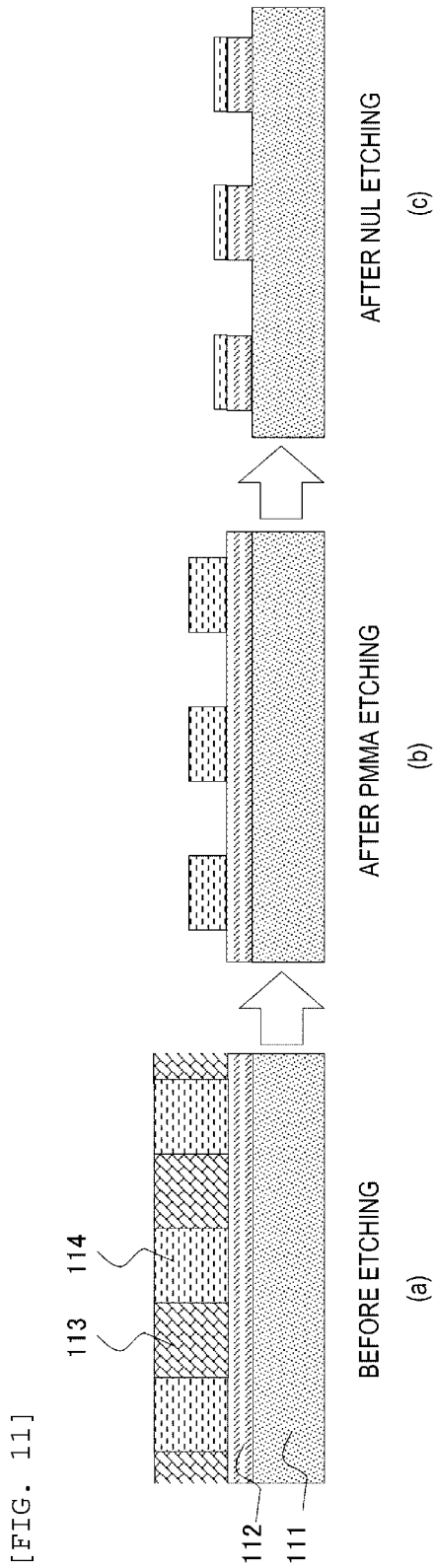

[FIG. 12]
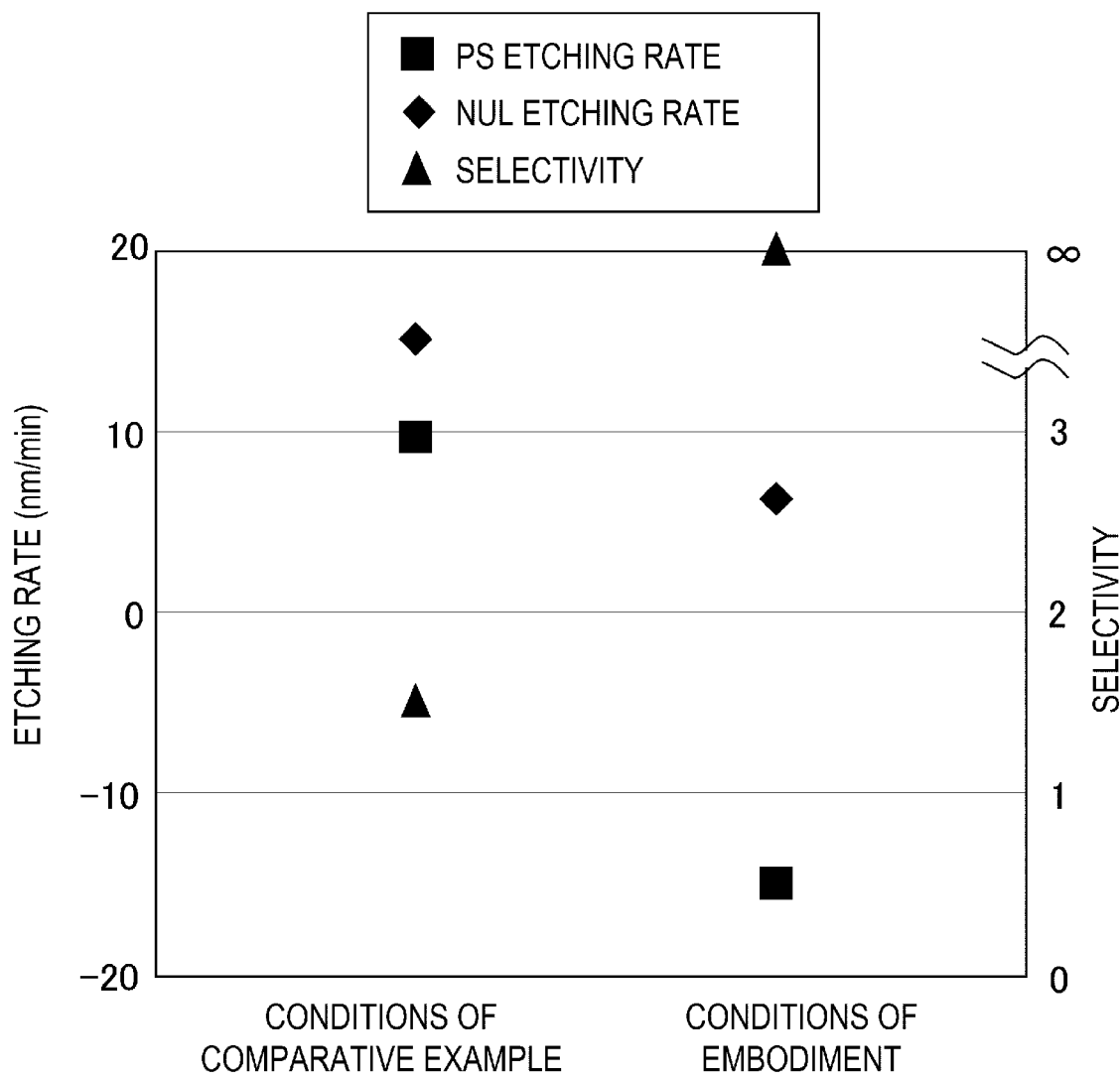

[FIG. 13]
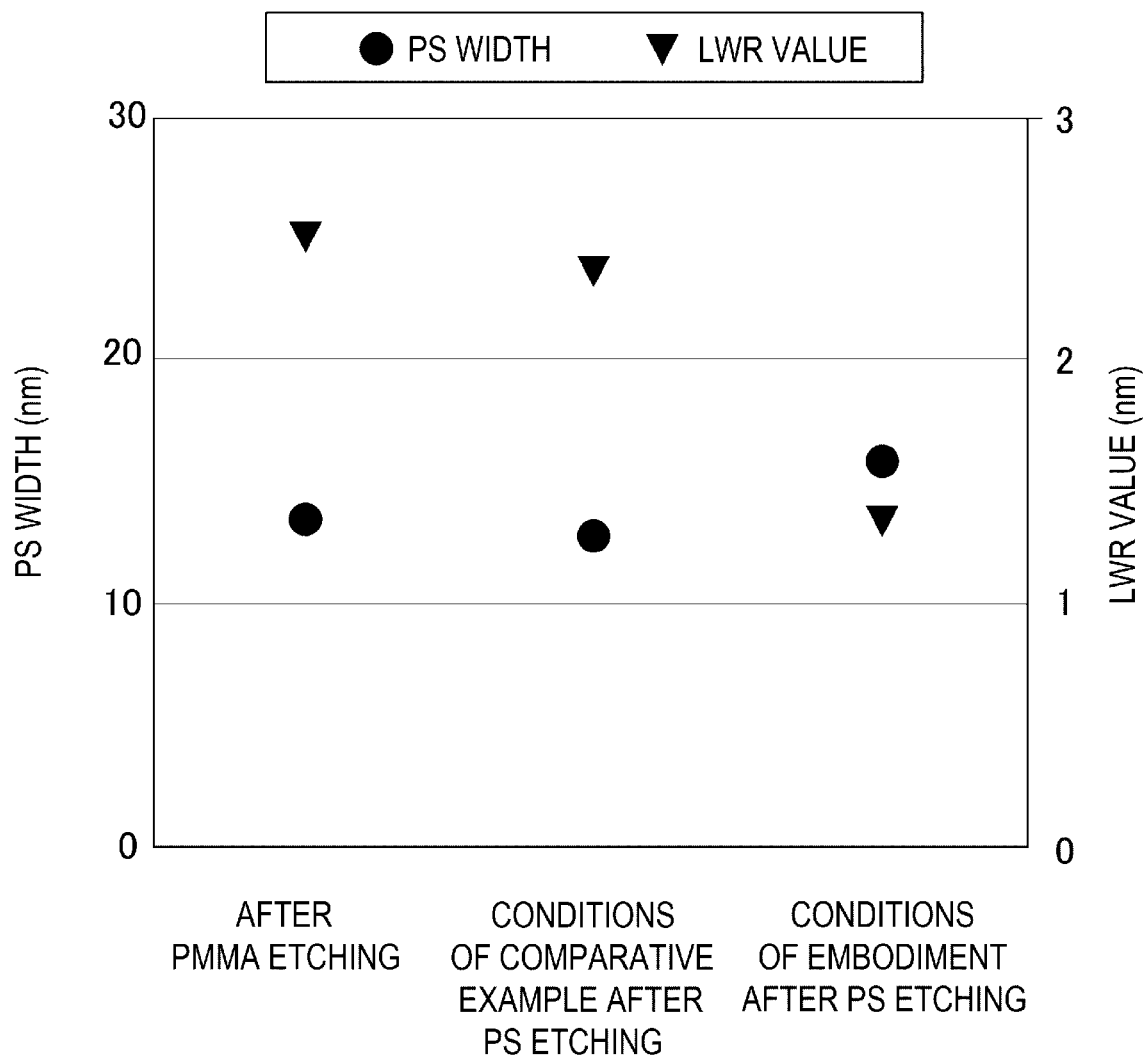

PLASMA PROCESSING METHOD

TECHNICAL FIELD

The present invention relates to a plasma processing method.

BACKGROUND ART

In a manufacturing process of a semiconductor device and a manufacturing process of devices such as micro electro mechanical systems (MEMS), it is required to cope with miniaturization and integration of components included in the semiconductor device and the like. For example, in an integrated circuit or a MEMS system, nanoscaling of a structure is further promoted.

In general, in the manufacturing process of the semiconductor devices, a lithography technique is used to form a fine pattern. In this technique, a photoresist material is coated to a laminated thin film formed on a semiconductor substrate and is irradiated with ultraviolet rays or the like by an exposure apparatus to transfer a circuit pattern of a photo mask to the photoresist material, and a development processing is further performed to form a fine pattern of a photoresist. Thereafter, an etching processing using plasma is performed using a photoresist pattern as an etching mask, whereby a thin film can be selectively removed and a pattern similar to the photo mask can be implemented as a three-dimensional object.

In recent years, in order to correspond to the acceleration of the miniaturization of large scale integration (LSI), the resolution of the exposure apparatus has been improved in a pattern transfer process performed by the exposure apparatus. In general, in order to advance the miniaturization, it is necessary to improve a process constant (k1) determined by an exposure wavelength (λ), the number of lens apertures (NA), resist performance, and the transfer process. Recently, a reduction in wavelength of the exposure wavelength by adopting an ArF laser (wavelength: 193 nm) and an improvement of NA by using an immersion exposure technique have been carried out.

Further, a double patterning technique that divides the mask of the circuit pattern into two masks, enlarges a minimum pitch of the exposure pattern, and improves k1 is also adopted. As for the double patterning technique, various methods relating to exposure and development have been proposed. For example, there are a double exposure method in which exposure is continuously performed twice, a method of performing the etching processing after first exposure and then performing second exposure, and a self-aligned method in which a spacer is formed after pattern formation and the spacer is used as the mask pattern.

However, when a technique of performing exposure a plurality of times as described above is used, problems such as an increase in process numbers, a decrease in throughput, and an increase in manufacturing cost occur. Here, a patterning method based on an extreme ultraviolet (EUV) lithography technique using an extreme ultraviolet ray having a wavelength of 13.5 nm and/or a directed self assembly (DSA) lithography technique using a self-assembly material has begun to be adopted.

The EUV lithography technique can achieve a resolution of 20 nm half pitch or less by one exposure by using an extreme ultraviolet ray having a wavelength of 13.5 nm, and is therefore adopted as an exposure technique responsible for the next generation of the ArF immersion lithography. In the EUV lithography technique, an extremely short wavelength is used, and thus there is a maximum advantage that a high resolution can be obtained even with a low NA according to Rayleigh.

Theoretically, a resolution with a line width of 22 nm to 32 nm in the case of NA=0.25, a resolution with a line width of 16 nm in the case of NA=0.35, and a resolution with a line width of 10 nm or less in the case of NA=0.4 or more can be obtained, and thus the EUV lithography technique is highly expected as an ultrafine pattern exposure technique. As a resist used in the EUV lithography technique (hereinafter referred to as an "EUV resist"), for example, a structure in which patterning is performed on a silicon anti-reflection coating (SiARC), which is an anti-reflection film of a Si-containing material, or spin on glass (SOG) based on hydroxy silsesquioxane is generally adopted.

On the other hand, in the DSA lithography technique, a pattern is formed by utilizing phase separation of a material without requiring a special exposure apparatus. As the self-assembly material, a diblock polymer containing a hydrophilic polymer or a hydrophobic polymer is typically used, and typical examples thereof include a diblock polymer containing polystyrene (hereinafter abbreviated as "PS") and polymethacrylic acid (hereinafter abbreviated as "PMMA"). A patterning formation process of the DSA lithography technique is extremely simple, including only creating a guide pattern before coating the diblock polymer, forming a neutral film (hereinafter abbreviated as "NUL"), and baking after the coating.

The pattern formation using the DSA lithography technique is also called a dry development process because PMMA is dry-etched with plasma and development is performed after the pattern formation, and then, the NUL, which is a material to be etched, is etched using PS formed by the PMMA etching as a mask material.

In this way, examples of a feature of the mask pattern formed by the EUV lithography technique and the DSA lithography technique includes that the mask is a thin film having a very low mask height. In the case of the EUV lithography technique, the mask height is generally 30 nm or less in view of the resolution of the resist, pattern collapse during development, and the like. Meanwhile, in the case of the DSA lithography technique, the mask height is also generally 30 nm or less, which is the same as a pitch width (PS width+PMMA width).

In this way, in the case of a thin film having a very low mask height, it is very important to selectively etch the film to be etched with respect to the mask material. In addition, reduction in roughness of a pattern edge is important along with the miniaturization, and in particular, reductions in line edge roughness (LER: unevenness in line end) and a line width roughness (LWR: unevenness in line width) on a line pattern are required.

This is because a width of a gate pattern, that is, a gate length greatly influences transistor performance. Specifically, the LWR having a period shorter than that of a transistor width Wg causes a short channel effect in which the gate length is locally shortened, so that a leakage current increases and a threshold voltage decreases. Meanwhile, the LWR having a period longer than that of the transistor width Wg causes fluctuation of the gate length across a plurality of transistors, and causes a variation in transistor performance.

In this way, in recent years, along with the miniaturization of the semiconductor device, a complication of a structure, and a diversification of materials, an improvement in an etching selectivity between the mask material and the material to be etched and a reduction in roughness are further required. As a technique of improving the etching selectivity, for example, PTL 1 discloses a method of improving a selectivity between a mask material and a material to be etched by using a gas capable of generating a deposition film containing components same as those of the mask material.

CITATION LIST

Patent Literature

PTL 1: JP-A-2013-118359

SUMMARY OF INVENTION

Technical Problem

According to the technique in PTL 1, in a case where the mask material is SiO and the material to be etched is SiN, or the mask material is TaN or WN and the material to be etched is Poly-Si, or the mask material is Poly-Si and the material to be etched is SiN as a combination of the mask material and the material to be etched, it is possible to improve the etching selectivity of the material to be etched with respect to the mask material by generating the deposition film containing components same as those of the mask material on the mask material and selecting and using a gas in which the etching proceeds for one material to be etched.

As described above, in the case of a limited combination of the mask material and the material to be etched, selective etching as described above can be performed by selecting a gas to be used. However, in recent years, with the diversification of materials and the complication of the structure, there is a case where it is very difficult to form the deposition film containing components same as those of the mask material, and to select a gas in which etching proceeds for one material to be etched.

In the case of improving the etching selectivity, it is ideal that the deposition film is formed on the mask material and the etching proceeds for the material to be etched, but it is sufficient if the deposition film is formed on the mask material and no deposition film is formed on the material to be etched. This is because that if the deposition film is selectively formed only on the mask material, the mask height increases as a result, and it is possible to sufficiently secure a remaining amount of the mask height even if the selectivity of the material to be etched is low when etching the material to be etched in the next step.

In the case of the EUV lithography technique, as described above, a structure in which the EUV resist is patterned on the SiARC or the SOG is generally used, and the SiARC or the SOG, which is the material to be etched, is etched using the EUV resist as the mask material. However, there is a problem that it is very difficult to form the deposition film containing components same as those of the resist, which is the mask material by the technique in PTL 1, to proceed the etching on the SiARC or the SOG, which is the material to be etched, or to select a gas in which the deposition film is not formed.

Meanwhile, in the case of the DSA lithography technique, there is only a slight difference in compositions among film structures of PS, PMMA, and the NUL. In particular, for example, the NUL has a neutral film structure and has only a slight difference in composition, such as a diblock polymer containing about 50% PMMA and about 50% PS. In the case of the DSA lithography technique, as described above, PMMA or the NUL, which is the material to be etched, is etched using PS as the mask material. However, there is a problem that it is very difficult to form the deposition film containing components same as those of PS, which is the mask material by the technique in PTL 1, to proceed the etching on PMMA or the NUL, which is the material to be etched, or to select a gas in which the deposition film is not formed.

Therefore, when the material to be etched is etched using a pattern formed by the EUV lithography technique and the DSA lithography technique as the mask material, a technique of improving the selectivity is required regardless of the gas. In addition, as an important problem in the EUV lithography technique and the DSA lithography technique, the reductions in LER roughness and in LWR roughness are increased, but PTL 1 does not mention the reduction in roughness, and does not examine a countermeasure thereof. Therefore, along with the diversification of materials and the complication of the structure, there has been a demand for a technique of improving the selectivity and reducing the roughness regardless of the gas.

The invention has been made in view of such a problem, and an object thereof is to provide a plasma processing method capable of improving the etching selectivity of the material to be etched with respect to the mask material and reducing the roughness of a side wall of the mask pattern.

Solution to Problem

In order to solve the above problem, a typical plasma processing method according to the invention is
a plasma processing method of selectively depositing a deposition film on a mask material with respect to a material to be etched, the plasma processing method including
controlling an etching parameter so that an incubation time of the mask material is shorter than an incubation time of the material to be etched.

Advantageous Effect

According to the invention, it is possible to provide a plasma processing method capable of improving the etching selectivity of the material to be etched with respect to the mask material and reducing the roughness of the side wall of the mask pattern.

Problems, configurations, and effects other than those described above will be clarified by descriptions of the following embodiments.

BRIEF DESCRIPTION OF DRAWINGS

FIG. 1 is a diagram showing a configuration of a microwave plasma etching apparatus applied to the invention.

FIG. 2 is a diagram showing an etching progress process in a case where a resist formed by an EUV lithography is used as a mask material.

FIG. 3 is a diagram showing an EUV resist etching rate, a SiARC etching rate, and a selectivity.

FIG. 4 is a diagram showing an EUV resist width and an LWR value.

FIG. 5 is a diagram showing an etching parameter adjustment procedure according to a first embodiment.

FIG. 6 is a diagram showing a microwave power supply power dependence at a first stage in a condition adjustment procedure according to a first embodiment.

FIG. 7 is a diagram showing a radio frequency bias power supply power dependence at a second stage in the condition adjustment procedure according to the first embodiment.

FIG. 8 is a diagram showing deposition rates of a deposition film on an EUV resist and of a deposition film on a SiARC at a third stage in the condition adjustment procedure according to the first embodiment.

FIG. 9 is a diagram showing transitions in deposition amounts of the deposition films on the EUV resist and on the SiARC, which can be estimated from results on FIG. 8, and transitions in microwave power supply power output and radio frequency bias power supply power output at this time.

FIG. 10 is a diagram showing an incubation time in the first embodiment by extracting time 0 msec to 0.5 msec of the transition of the deposition amount of the deposition film shown in FIG. 9.

FIG. 11 is a diagram showing an etching progress process when using DSA lithography.

FIG. 12 a diagram showing a PS etching rate, a NUL etching rate, and a selectivity.

FIG. 13 is a diagram showing a PS width and a LWR value.

DESCRIPTION OF EMBODIMENTS

Hereinafter, each embodiment of the invention is described with reference to the drawings.

In the present embodiment, as a technique of improving a selectivity and reducing a roughness regardless of a gas, attention is paid to a difference in incubation times caused by a slight difference between structures of a mask material and a material to be etched, and a film thickness of a deposition film to be formed on each surface is controlled. The incubation time refers to a time from a start of film formation to a time when a generated film formation species expands to a size of a critical nucleus and appears as a film. In addition, this time varies even when there is only a slight difference in composition between film structures of the mask material and the material to be etched. That is, the deposition film can be selectively deposited by utilizing the difference in incubation times.

In the present embodiment, a plasma processing method that selectively deposits the deposition film on the mask material with respect to the material to be etched includes controlling a plasma etching parameter (simply referred to as etching parameter) so that an incubation time of the mask material is shorter than an incubation time of the material to be etched.

In addition, in the plasma processing method that selectively deposits the deposition film on the mask material with respect to the material to be etched, it is preferable to control the plasma etching parameter so that the incubation time of the mask material is shorter than the incubation time of the material to be etched and the deposition film is not deposited on the material to be etched.

Further, in the plasma processing method that selectively deposits the deposition film on the mask material with respect to the material to be etched, it is preferable to control the plasma etching parameter so that the incubation time of the mask material is shorter than the incubation time of the material to be etched and the etching proceeds without depositing the deposition film on the material to be etched.

FIG. 1 shows a schematic cross sectional diagram of an electron cyclotron resonance (ECR) microwave plasma etching apparatus (hereinafter, also referred to as a "plasma processing apparatus") according to an embodiment of the present invention. In the microwave plasma etching apparatus, a shower plate 102 (for example, made of quartz) for supplying an etching gas into a vacuum container 101 and a dielectric window 103 (for example, made of quartz) are disposed in an upper portion of the vacuum container 101 whose upper portion is open, and the vacuum container 101 is sealed to form a processing chamber 104 which is a plasma processing chamber. A gas supply device 105 for flowing the etching gas is connected to the shower plate 102.

Further, a vacuum exhaust device 106 is connected to the vacuum container 101 via an exhaust on-off valve 117 and an exhaust rate variable valve 118. The inside of the processing chamber 104 is depressurized by opening the exhaust on-off valve 117 and driving the vacuum exhaust device 106, and is brought into a vacuum state in which the pressure is reduced from an atmospheric pressure. The pressure in the processing chamber 104 is adjusted to a desired pressure by using the exhaust rate variable valve 118.

The etching gas is supplied from the gas supply device 105 into the processing chamber 104 via the shower plate 102, and is exhausted by the vacuum exhaust device 106 via the exhaust rate variable valve 118.

A sample mounting electrode 111, which is a sample stage, is provided at a lower portion of the vacuum container 101 so as to face the shower plate 102. In order to supply a first radio frequency power for generating plasma to the processing chamber 104, a waveguide 107 for transmitting an electromagnetic wave is provided above the dielectric window 103. The electromagnetic wave to be transmitted to the waveguide 107 is oscillated from an electromagnetic wave generating power supply 109, which is a microwave power supply, via a matching unit 119. A pulse generating unit 121 is attached to the electromagnetic wave generating power supply 109, whereby microwaves can be pulse-modulated at any set repetition frequency. A frequency of the electromagnetic wave is not particularly limited, and in the present embodiment, a microwave of 2.45 GHz is used.

A magnetic field generating coil 110 that generates a magnetic field is provided outside the processing chamber 104, the electromagnetic wave oscillated from the electromagnetic wave generating power supply 109, by interaction with the magnetic field generated by the magnetic field generating coil 110, generates high density plasma in the processing chamber 104, and an etching process is performed on a wafer 112 which is a sample and disposed on the sample mounting electrode 111 which is the sample stage.

The shower plate 102, the sample mounting electrode 111, the magnetic field generating coil 110, the exhaust on-off valve 117, the exhaust rate variable valve 118, and the wafer 112 are disposed coaxially with respect to a central axis of the processing chamber 104, and therefore a flow of the etching gas, radicals and ions generated by the plasma, and reaction products generated by the etching are coaxially supplied to the wafer 112 and exhausted. This coaxial arrangement brings effects that uniformity of an etching rate and an etching shape on a wafer plane is close to axial symmetry, and the uniformity of a wafer processing is improved.

The sample mounting electrode 111 is coated with a sprayed film (not shown) on an electrode surface thereof, and is connected to a DC power supply 116 via a radio frequency filter 115. Further, a radio frequency bias power supply 114 is connected to the sample mounting electrode 111 via a matching circuit 113. The radio frequency bias power supply 114 is connected to the pulse generating unit 121 and can selectively supply a time-modulated second radio frequency power to the sample mounting electrode 111. The frequency of the radio frequency bias is not particularly limited, and in the present embodiment, a radio frequency bias of 400 kHz is used.

A control unit 120 that controls the above-mentioned ECR microwave plasma etching apparatus, by an input unit (not shown), controls a repetition frequency or a duty ratio including an on/off timing of pluses of the electromagnetic wave generating power supply 109, the radio frequency bias power supply 114, and the pulse generating unit 121, and etching parameters such as a gas flow rate, a processing pressure, a microwave power, a radio frequency bias power, a coil current, a pulse-on time, and a pulse-off-time for performing etching.

The duty ratio is a ratio of an on-period to one period of the pulse. In the present embodiment, the repetition frequency of the pulse can be changed from 5 Hz to 10 kHz, and the duty ratio can be changed from 1% to 90%. Further, the setting of the time modulation may be an on-period or an off-period. Next, each embodiment using the above-mentioned microwave plasma etching apparatus according to the present embodiment will be described.

First Embodiment

FIG. 2 shows an etching progress process in a case where a resist formed by EUV lithography is used as the mask material. In the present embodiment, a sample having a structure in which an EUV resist 203 is patterned on a SiARC 202 formed on an organic planarization layer (OPL) 201 is used. Alternatively, a sample having a structure in which the EUV resist is patterned on a SOG formed on a spin on carbon (SOC) may be used.

The etching in which the mask material is the EUV resist 203 and the material to be etched is the SiARC 202 proceeds in a direction of an arrow shown in FIG. 2. FIG. 2 shows (a) a state before the etching, (b) a state during the etching, and a state (c) after the etching. At this time, for example, when the EUV resist 203 and the SiARC 202 have the same film thickness, a pattern width dimension is reduced if the selectivity during the etching is less than 1, and thus it is desirable to increase the selectivity during the etching, or to selectively deposit a deposition film on the EUV resist 203 to increase the film thickness according to the mask material.

Here, the etching selectivity of the SiARC 202 with respect to the EUV resist 203 is a value obtained by dividing an etching rate of the SiARC 202 by an etching rate of the EUV resist 203. When the film thickness of the EUV resist 203 is smaller than the film thickness of the SiARC 202, it is desirable to use a higher selectivity or to selectively deposit a deposition film with a larger film thickness on the EUV resist 203 to further increase the film thickness according to the mask material.

On the other hand, in order to reduce a roughness of a side wall of the EUV resist 203 before the etching from being transferred to a side wall of the SiARC 202 during the etching of the SiARC 202, it is desirable to reduce the roughness by selectively depositing a deposition film on the side wall of the EUV resist 203. Therefore, in order to improve the etching selectivity of the SiARC 202 with respect to the EUV resist 203 as compared with related-art techniques and to reduce the roughness, it is necessary to selectively deposit a deposition film on an upper surface and the side wall of the EUV resist 203.

At this time, when the deposition film is deposited on the upper surface of the SiARC 202, which is the material to be etched, the etching is inhibited, and therefore, the deposition film should not be deposited on the upper surface of the SiARC 202, or the etching should be advanced.

The etching was performed using a mixed gas containing an Ar gas, a $N_2$ gas, and a $CH_4$ gas under conditions of a gas pressure, a microwave power supply power, a microwave power supply repetition frequency, a microwave power supply duty ratio, a radio frequency bias power supply power, a radio frequency bias power supply repetition frequency, and a radio frequency bias power supply duty ratio as shown in Table 1.

TABLE 1

| | |
|---|---|
| AR gas | 50 sccm |
| $N_2$ gas | 100 sccm |
| $CH_4$ gas | 2 sccm |
| Gas pressure | 15 Pa |
| Microwave power supply power | 800 W |
| Microwave power supply repetition frequency | 1 kHz |
| Microwave power supply duty ratio | 50% |
| Radio frequency bias power supply power | 20 W |
| Radio frequency bias power supply repetition frequency | 1 kHz |
| Radio frequency bias power supply duty ratio | 20% |

Under conditions of the present embodiment and conditions of Comparative Example, samples before the etching shown in FIG. 2 were etched. Thereafter, the samples were cleaved, each cross section thereof was observed and the length was measured by a scanning electron microscope (SEM), and the etching rate, the etching selectivity, and the EUV resist width were compared and examined. In addition, an LWR roughness value was compared and examined with SEM observation and length measurement from directly above the sample.

FIG. 3 shows the etching rate and the etching selectivity. As shown in FIG. 3, under the conditions of Comparative Example, the etching selectivity of the SiARC with respect to the EUV resist is 2, which is a value of 1 or more, and the etching rate of the EUV resist and the etching rate of the SiARC are positive, so that both the etching of the EUV resist and the etching of the SiARC are proceeding.

Meanwhile, under the conditions of the present embodiment, the etching rate of the SiARC is lower than that under the conditions of Comparative Example, and the etching rate of the EUV resist is a negative value, indicating that the deposition film is formed on the EUV resist. Therefore, under the conditions of the present embodiment, the selectivity of the SiARC with respect to the EUV resist is infinite.

Next, FIG. 4 shows the EUV resist width and the LWR value. When conditions before the etching are compared with the conditions of Comparative Example, the EUV resist width is slightly reduced and the LWR value is also slightly reduced due to the etching in the conditions of Comparative Example. That is, it can be seen that the LWR value is slightly reduced as the etching proceeds in a horizontal direction of the EUV resist by the etching.

Meanwhile, under the conditions of the present embodiment, the EUV resist width is increased by about 2 nm, and the LWR value is significantly reduced by about 30%. This indicates that, under the conditions of the present embodiment, the LWR value is also significantly reduced by forming the deposition film on the side wall of the EUV resist. Thus, in the present embodiment, it is possible to significantly improve the etching selectivity of the SiARC with respect to the EUV resist and also significantly reduce the LWR value, as compared with those under the conditions of Comparative Example.

Next, a condition adjustment procedure and a mechanism until the conditions of the present embodiment are reached will be described. In the present embodiment, the mixed gas containing the Ar gas, the $N_2$ gas, and the $CH_4$ gas as shown in Table 1 is used.

In the present embodiment, the Ar gas is used as a dilution gas. Alternatively, He, Ne, Kr, Xe, $H_2$, or the like, which is generally used as the dilution gas, may be used. In addition, the $CH_4$ gas and the $N_2$ gas are used as the gas for forming the deposition film. Alternatively, depending on the mask material and the material to be etched, which are targets, and the condition adjustment procedure process to be described later, $C_2H_2$, $C_2H_4$, $CHF_3$, $CH_3F$, $CH_2F_2$, and the like, which are gases containing carbon C, may be used, and BN, $NF_3$, $NCl_3$, $Nbr_3$, and the like, which are gases containing nitrogen N, may be used.

The condition adjustment procedure is shown in FIG. 5. At a first stage of the condition adjustment procedure, the microwave power supply power is adjusted. At this time, as noted in FIG. 5, the microwave power supply power is not repeated, and a combination of the gases and the gas pressure may be set so that the deposition film is deposited on both the mask material and the material to be etched. Therefore, the radio frequency bias power supply power is set to 0 W in order to prevent sputter etching due to ions.

Here, the film thickness of the deposition film is changed due to the gas flow rate, the gas pressure, and the microwave power supply power, and thus, for example, at the first stage of the condition adjustment procedure according to the first embodiment, a condition under which the film thickness of the deposition film is about 0 nm to 2 nm is adopted.

FIG. 6 shows the microwave power supply power dependence at the first stage of the condition adjustment procedure according to the first embodiment. Here, the microwave power supply power is set to 800 W so that the deposition rates of the deposition films on the EUV resist and on the SiARC are 0 nm/min to 2 nm/min.

Next, at a second stage of the condition adjustment procedure, the radio frequency bias power supply power is adjusted. At this time, as shown in FIG. 5, the radio frequency bias power supply power is not repeated, the microwave power supply is the same as that at the first stage, and the second stage of the condition adjustment procedure according to the first embodiment adopts a condition that the deposition rate of the deposition film is on the negative side, that is, is about 0 nm/min to −2 nm/min in which the etching proceeds.

FIG. 7 shows the radio frequency bias power supply power dependence at the second stage of the condition adjustment procedure according to the first embodiment. Here, the radio frequency bias power supply power is set to 20 W so that the deposition rates of the deposition films on the EUV resist and on the SiARC are 0 nm/min to −2 nm/min.

An important matter up to the second stage of the condition adjustment procedure according the first embodiment is to determine conditions under which, taking a deposition rate of 0 nm/min for the deposition film as a center, a positive side by adjusting the microwave power supply power, that is, a side where the deposition film is deposited, is symmetrical with a negative side by adjusting the radio frequency bias power supply power, that is, a side where the etching is performed. Accordingly, with the microwave repetition frequency, the microwave power supply duty ratio, the radio frequency bias power supply repetition frequency, and the radio frequency bias power supply duty ratio, which are adjusted at a third stage described below, the deposition rates of the deposition films on the EUV resist and on the SiARC can be adjusted within a range of ±2 nm/min.

Next, at the third stage (adjustment stage) of the condition adjustment procedure according to the first embodiment, at a side where the deposition rate of the deposition film on the EUV resist is positive, that is, a side where the deposition film is deposited, while at a side where the deposition rate of the deposition film on the SiARC is 0 nm/min or negative, that is, a side where the deposition film is not deposited and the etching does not proceed, or a side where the etching proceeds, the microwave power supply repetition frequency, the microwave power supply duty ratio, the radio frequency bias power supply repetition frequency, and the radio frequency bias power supply duty ratio, which are the plasma etching parameters, are adjusted. That is, the etching parameter control includes a step of generating plasma by the pulse-modulated first radio frequency power and a step of supplying the pulse-modulated second radio frequency power to the sample stage. In such a case, it is preferable that a period of a pulse that modulates the first radio frequency power is equal to a period of a pulse that modulates the second radio frequency power, and a duty ratio of the pulse that modulates the first radio frequency power is larger than a duty ratio of the pulse that modulates the second radio frequency power.

FIG. 8 shows the deposition rates of the deposition films on the EUV resist and on the SiARC at the third stage of the condition adjustment procedure according to the first embodiment. When the microwave repetition frequency is set to 1 kHz, the microwave power supply duty ratio to 50%, the radio frequency bias power supply repetition frequency to 1 kHz, and the radio frequency bias power supply duty ratio to 20%, the deposition rate of the deposition film on the EUV resist is 1.5 nm/min and the deposition rate of the deposition film on the SiARC is −0.2 nm/min.

FIG. 9 shows transitions in deposition amounts of the deposition films of the EUV resist and the SiARC, which can be estimated from results of FIG. 8, and transitions in microwave power supply power and radio frequency bias power supply power output at this time. Since the repetition frequencies of the microwave power supply power output and the radio frequency bias power supply power are 1 kHz, one period is formed in 1 msec, and an output ON time is equal to the ratio of each duty ratio.

When the microwave power supply power is OFF, plasma is not generated, and therefore the deposition of the deposition film or the etching does not proceed. Further, when the radio frequency bias power supply power output is ON, the deposition rate is equal to or lower than the etching rate, so that there is a side where the deposition film does not deposit and the etching does not proceed, or the etching proceeds. Therefore, each transition in deposition amount of the deposition film on the EUV resist and on the SiARC follows a dotted line shown in FIG. 9.

Here, in FIG. 10, a time of 0 to 0.5 msec of the transition in deposition amount of the deposition film shown in FIG. 9 is extracted and the incubation time of the first embodiment will be described. The incubation time of the deposition film deposited on the EUV resist is a time until the deposition is started, that is, a time until the graph has a positive slope. Meanwhile, the incubation time of the deposition film deposited on the SiARC film is a time further repeated in addition to a period of 0.5 msec shown on the horizontal axis of the graph. That is, it can be said that the incubation time of the deposition film on the EUV resist is shorter than the incubation time of the deposition film deposited on the SiARC.

Therefore, by adjusting the plasma etching parameters, that is, the microwave power supply repetition frequency, the microwave power supply duty ratio, the radio frequency bias power supply repetition frequency, and the radio frequency bias power supply duty ratio, it is possible to make the incubation time of the deposition film deposited on the EUV resist as the mask material shorter than the incubation time of the deposition film deposited on the SiARC as the material to be etched. In order to obtain a desired incubation time, it is sufficient to adjust at least one value of the microwave power supply repetition frequency, the microwave power supply duty ratio, the radio frequency bias power supply repetition frequency, and the radio frequency bias power supply duty ratio. This adjustment can be carried out by the control unit 120 in the microwave plasma etching apparatus shown in FIG. 1.

In the first embodiment, as shown in Table 1, the conditions of the microwave power supply and the radio frequency bias power supply are optimal. However, depending on the mask material and the material to be etched, which are targets, it is desired to appropriately select the microwave power supply power, the radio frequency bias power supply power, the microwave power supply repetition frequency, the radio frequency bias power supply repetition frequency, the microwave power supply duty ratio, and the radio frequency bias duty ratio and adjust according to the adjustment procedure in FIG. 5 to obtain optimal conditions.

Second Embodiment

FIG. 11 shows an etching progress process when using a DSA lithography technique. In the present embodiment, a sample having a structure in which PMMA 113 and PS 114 are patterned on a NUL 112 formed on SiN 111 is used.

Firstly, a PS mask pattern is formed by etching PMMA, which is the material to be etched, using PS as the mask material. Next, the NUL is etched using the formed PS as the mask pattern. The etching proceeds in a direction of an arrow shown in FIG. 11. FIG. 11 shows (a) a state before the etching, (b) a state after the PMMA etching, and (c) a state after the NUL etching.

In the present embodiment, a case where it is applied to the NUL etching will be described. The etching was performed using a mixed gas containing an Ar gas, a $N_2$ gas, and a $CH_4$ gas and conditions of a gas pressure, a microwave power supply power, a microwave power supply repetition frequency, a microwave power supply duty ratio, a radio frequency bias power supply power, a radio frequency bias power supply repetition frequency, and a radio frequency bias power supply duty ratio as shown in Table 2. Under conditions of the present embodiment and conditions of Comparative Example, samples after the PMMA etching shown in FIG. 11 were etched.

TABLE 2

| AR gas | 300 sccm |
| --- | --- |
| $N_2$ gas | 30 sccm |
| $CH_4$ gas | 10 sccm |
| Gas pressure | 3.5 Pa |
| Microwave power supply power | 800 W |
| Microwave power supply repetition frequency | 1 kHz |
| Microwave power supply duty ratio | 50% |
| Radio frequency bias power supply power | 50 W |
| Radio frequency bias power supply repetition frequency | 1 kHz |
| Radio frequency bias power supply duty ratio | 50% |

Thereafter, the samples were cleaved, each cross section thereof was observed and the length was measured by a scanning electron microscope (SEM), and the etching rate, the etching selectivity, and the PS width were compared and examined. In addition, the LWR roughness value was compared and examined with SEM observation and length measurement from directly above the sample.

FIG. 12 shows the etching rate and the etching selectivity. As shown in FIG. 12, under the conditions of Comparative Example, the etching selectivity of the NUL with respect to PS is 1.5, which is a value of 1 or more, and the etching rate of PS and the etching rate of the NUL are positive, so that both the etching of PS and the etching of the NUL are proceeding.

Meanwhile, under the conditions of the present embodiment, the etching rate of the NUL is lower than that under the conditions of Comparative Example, but the etching rate of PS is a negative value, indicating that the deposition film is formed on PS. Therefore, under the conditions of the present embodiment, the selectivity of the NUL with respect to PS is infinite.

Next, FIG. 13 shows the PS width and the LWR value. When conditions after the PMMA etching and the conditions of Comparative Example are compared, the PS width is slightly reduced and the LWR value is also slightly reduced due to the etching in the conditions of Comparative Example. That is, it can be seen that the LWR value is slightly reduced as the etching proceeds in the horizontal direction of the EUV resist by the etching.

Meanwhile, under the conditions of the present embodiment, the PS width is increased by about 2 nm, and the LWR value is significantly reduced by about 60%. This indicates that, under the conditions of the present embodiment, the LWR value is also significantly reduced by forming the deposition film on the side wall of PS. Thus, in the present embodiment, it is possible to significantly improve the etching selectivity of the NUL with respect to PS and also significantly reduce the LWR value, as compared with those under the conditions of Comparative Example. The condition adjustment procedure up to the conditions of the present embodiment is carried out according to FIG. 5.

In the present embodiment, an application example in an electron cyclotron resonance (ECR) type microwave plasma etching apparatus using microwaves has been described, but the present invention is not limited thereto. The plasma processing method may be applied to a plasma etching apparatus using a capacitive coupling type or inductive coupling type plasma generating unit. In addition, it is preferable that the etching parameter is controlled using a mixed gas containing an argon gas, a nitrogen gas, and a methane gas.

Further, in the present embodiment, after the deposition film is formed in the processing chamber of the etching apparatus, an etching processing is continuously performed in the same processing chamber. As a method of forming the deposition film generally used in a manufacturing process of a semiconductor device, there is a film forming apparatus using an evaporation method, a sputtering method, a vapor phase growth method, an atomic layer deposition (ALD) method, or the like. When the deposition film is formed according to the present embodiment by using these film forming apparatuses, a time for conveying the wafer from the processing chamber of the film forming apparatus to the processing chamber of the etching apparatus or from the processing chamber of the etching apparatus to the processing chamber of the film forming apparatus is required, and the throughput is decreased. In addition, when the processing chamber of the film forming apparatus and the processing chamber of the etching apparatus are not connected via a vacuum conveyance path, the wafer is exposed to the atmosphere during conveying, and therefore the pattern surface after film formation or etching reacts with components in the atmosphere (nitrogen, oxygen, etc.) to deteriorate the film quality, which hinders the subsequent processing. Further, when the deposition film is formed on the side wall of a fine mask pattern by the EUV and DSA lithography techniques used in the present embodiment, an ALD apparatus using an ALD method is considered to be suitable, but due to the principle of the ALD method, the deposition film is formed on the side wall of the pattern and at the same time, the deposition film is also formed on the bottom surface of the pattern, which hinders the subsequent etching processing. Therefore, it can be said that the method of forming the deposition film and performing the etching processing in the processing chamber of the etching apparatus shown in the present embodiment is optimal.

As described above, the plasma etching method of the present embodiment selectively deposits the deposition film on the mask material with respect to the material to be etched, and therefore the plasma etching parameter is controlled so that the incubation time of the deposition film deposited on the mask material is shorter than the incubation time of the deposition film deposited on the material to be etched. Therefore, it is possible to significantly improve the etching selectivity of the material to be etched with respect to the mask material and significantly reduce the roughness of the side wall of the mask pattern as compared with the technique of Comparative Example.

REFERENCE SIGN LIST

- 101 vacuum container
- 102 shower plate
- 103 dielectric window
- 104 processing chamber
- 105 gas supply device
- 106 vacuum exhaust device
- 107 waveguide
- 109 electromagnetic wave generating power supply
- 110 magnetic field generating coil
- 111 sample mounting electrode
- 112 wafer
- 113 matching circuit
- 114 radio frequency bias power supply
- 115 radio frequency filter
- 116 DC power supply
- 117 exhaust on-off valve
- 118 exhaust rate variable valve
- 119 matching unit
- 120 control unit
- 121 pulse generating unit

The invention claimed is:

1. A plasma processing method of selectively depositing a deposition film on a mask material with respect to a material to be etched, the plasma processing method comprising: controlling an etching parameter by performing
    a first step of adjusting a microwave power supply power;
    a second step of adjusting a radio frequency bias power supply power; and
    a third step of adjusting at least one of a microwave power supply repetition frequency, a microwave power supply duty ratio, a radio frequency bias power supply repetition frequency, and a radio frequency bias power supply duty ratio so that an incubation time of the mask material is shorter than an incubation time of the material to be etched to cause a deposition rate of the deposition film on the mask material to be higher than a deposition rate of the deposition film on the material to be etched following an end of the incubation time of the deposition film on the mask material, to cause an unevenness in line width to be less than 1.5 nm when the mask material has a width of greater than 2 nm.

2. The plasma processing method according to claim 1, wherein the etching parameter control includes
    a step of generating a plasma by a pulse-modulated first radio frequency power, and
    a step of supplying a pulse-modulated second radio frequency power to a sample stage on which a sample on which the material to be etched is deposited is placed.

3. The plasma processing method according to claim 1, wherein
    the mask material is an EUV resist and the material to be etched is a SiARC.

4. The plasma processing method according to claim 1, wherein
    the mask material is PS and the material to be etched is PMMA.

5. The plasma processing method according to claim 1, wherein
    the etching parameter control is performed using a mixed gas of an argon gas, a nitrogen gas, and a methane gas.

6. The plasma processing method according to claim 2, wherein
    the etching parameter control is performed using a mixed gas of an argon gas, a nitrogen gas, and a methane gas.

7. The plasma processing method according to claim 2, wherein
    a period of a pulse that modulates the first radio frequency power and a period of a pulse that modulates the second radio frequency power are equal to each other, and
    a duty ratio of the pulse that modulates the first radio frequency power is larger than a duty ratio of the pulse that modulates the second radio frequency power.

8. The plasma processing method according to claim 7, wherein
    the mask material is an EUV resist and the material to be etched is a SiARC.

* * * * *